United States Patent
Annaratone et al.

[11] Patent Number: 5,849,372
[45] Date of Patent: Dec. 15, 1998

[54] RF PLASMA REACTOR AND METHODS OF GENERATING RF PLASMA

[75] Inventors: Beatrice Maria Annaratone; John Edward Allen, both of Oxford, United Kingdom

[73] Assignee: Isis Innovation Limited, Oxford, United Kingdom

[21] Appl. No.: 617,395

[22] Filed: Mar. 18, 1996

[51] Int. Cl.[6] ................................................. H05H 1/00
[52] U.S. Cl. ........................ 427/569; 216/71; 118/723 E
[58] Field of Search ................................. 427/569, 562, 427/535; 216/71; 118/723 E, 723 ER

[56] References Cited

U.S. PATENT DOCUMENTS

| | | | |
|---|---|---|---|
| 3,617,459 | 11/1971 | Logan | 204/192.23 |
| 4,096,315 | 6/1978 | Kubachi | 427/536 |
| 4,451,765 | 5/1984 | Gray | 315/248 |
| 4,566,403 | 1/1986 | Fournier | 118/718 |
| 4,664,938 | 5/1987 | Walker | 427/578 |
| 4,933,203 | 6/1990 | Curtins . | |
| 4,937,205 | 6/1990 | Nakayama et al. | 427/569 |
| 4,948,750 | 8/1990 | Kausche et al. | 427/574 |
| 5,272,417 | 12/1993 | Ohuni | 216/71 |
| 5,273,610 | 12/1993 | Thomas, III et al. | 118/723 E |
| 5,289,010 | 2/1994 | Shohet | 427/570 |
| 5,387,777 | 2/1995 | Bennett et al. | 118/50.1 |
| 5,453,305 | 9/1995 | Lee | 427/563 |
| 5,513,765 | 5/1996 | Usui | 216/71 |

OTHER PUBLICATIONS

Lerner, et al, ed, *Encyclopedia of Physics*, 2nd Ed., VCH Publishers, Inc., New York, 1991 (no month), excerpts of p. 916–917, 920–935, 1064–1069, 241–242 & 313–316.

Nonaka, S., "General Characteristics of the Maintenance Electric Fields in Planar Radio Frequency Discharges," *Journal of The Physical Society of Japan*, vol. 60, No. 9, Sep. 1991, pp. 3015 to 3024.

Kakagawa Kojn et al, JP62180747, Patent Abstracts of Japan, vol. 12, No. 33 Pub. date Aug. 8, 1987.

*Primary Examiner*—Marianne Padgett
*Attorney, Agent, or Firm*—Fish & Neave; Robert W. Morris

[57] ABSTRACT

A plasma reactor includes a pair of parallel plate electrodes (1,2) one of which is grounded and the other driven, mounted within a chamber (8) which is connected via a port (8a) to a control device (16) for controlling the pressure of the gas within the chamber (8). The driven electrode (1) is connected to a voltage supply which has a driving frequency of 13.56 MHz, via an amplifier (9) and a superposed higher resonance frequency via a variable frequency power generator (11). With the plasma reactor sheath resonance in the glow discharge between the electrodes (1,2) can be generated to have a standing wave and thereby ensuring a greater coupling of the power in the system.

16 Claims, 3 Drawing Sheets

RF PLASMA REACTOR AND METHODS OF GENERATING RF PLASMA

FIELD OF THE INVENTION

The present invention relates to an improved plasma reactor and to a method of operating the same. In particular the present invention is directed to a parallel plate plasma reactor suitable for use in etching and deposition treatments of wafers.

BACKGROUND

RF plasma reactors are used mainly in connection with etching and deposition of the components, for example semiconductors, insulators and metals which make up very-large-scale integrated (VLSI) electronic circuits. During manufacture of such components the rate at which either the etching or the deposition is performed and the quality of the component, that is the absence of defects, are of particular importance.

FIG. 1 of the accompanying drawings shows a simplified diagram of a parallel plate plasma reactor of the type with which the present invention is concerned. The device comprises a pair of metal plate electrodes 1,2 to which an RF voltage, typically at a frequency of 13.56 MHz, is applied from an RF power source 3. Electrode 1 is the driven electrode and electrode 2 is grounded. A wafer 4 to be treated is placed typically against the ground electrode 2, as shown.

A gas at a pressure commonly in the region of 50 Pa is passed between the plates, and is represented by the arrow A in FIG. 1. For etching the gas employed may be for example argon, $CF_4$ or $SF_6$. For deposition a film-forming gas such as methane or thiolene may be used.

The RF voltage is sufficient to cause the gas to break down, forming a plasma 5 between the plates containing roughly equal numbers of ions and electrons. At the same time a space charge region, referred to as the sheath 6,7 appears between the plasma and each of the electrodes. The plasma in these circumstances is a glow discharge plasma having no overall electrical charge.

The use of such a conventional plasma reactor at pressures in the range 10 to 50 Pa is described in U.S. Pat. No. 4,933,203 for the deposition of amorphous hydrogenated silicon. In U.S. Pat. No. 4,933,203 selection of the frequency at which the plasma reactor is driven, between 25 and 150 MHz, is described. The selection is on the basis of the ratio of the frequency f with respect to the electrode separation d. That is f/d must be in the range 30 to 100 MHz/cm. Hence, this document establishes a direct relationship between the frequency f and the electrode separation d, whereby increasing one requires a commensurate increase in the other.

SUMMARY OF THE INVENTION

With the present invention on the other hand, it has been found that for a fixed electrode separation appropriate selection of the frequency of the RF power source in combination with the pressure of the gas within the chamber can increase the amount of power which can be coupled to the system or can be used to couple the power more efficiently.

The present invention provides a method of generating a plasma in an evacuable chamber containing a first electrode spaced apart from a second electrode, the method comprising the steps of: supplying a gas into the chamber; connecting an RF power source between the first and second electrodes so as to generate a glow discharge plasma; and generating resonance in the plasma between the first and second electrodes by maintaining a predetermined pressure of gas within the chamber.

Preferably a control device is provided to maintain the pressure of the gas within the chamber. The control device may also be used to vary the pressure of the gas within the chamber until resonance in the glow discharge plasma is generated. In this way even if the exact conditions for generating the resonance are not known, resonance can be achieved through experimentation.

In an alternative aspect the present invention provides a method of generating a plasma in an evacuable chamber containing a first electrode spaced apart from a second electrode, the method comprising the steps of: supplying a gas into the chamber; connecting an RF power source between the first and second electrodes so as to generate a glow discharge plasma; and generating a voltage gradient in the plasma between the first and second electrodes within the chamber by maintaining a predetermined pressure of gas within the chamber.

The voltage gradient generated in the region between the electrodes in the chamber can be in the form of a standing wave which has a frequency which is a harmonic of the driving frequency of the RF power source. As mentioned above, a control device may be provided to maintain the pressure of the gas within the chamber and may also be used to vary the gas pressure when the exact conditions for the voltage gradient to be established are not known.

In either method it is preferred that the pressure of the gas within the chamber is maintained at less than 10 Pa and ideally less than 2 Pa. A preferred frequency of the RF power source is 13.56 MHz.

Where the exact conditions for generating the resonance or the standing wave are not known, the RF current between the electrodes may be monitored by means of a suitable meter. The current will tend towards a maximum when resonance or the standing wave is generated. Alternatively, the presence of a voltage gradient in the plasma between the electrodes in the chamber may be monitored directly by means of a high impedance probe.

In a further alternative, an additional RF power source may be connected to the electrodes so that the RF voltage applied to the electrodes is the superposition of two different frequencies. The additional RF power source may be a variable frequency power source and in particular one capable of supplying voltages at frequencies which are harmonics of the driving frequency. Furthermore, the additional power source preferably supplies an RF voltage having a peak-to-peak voltage less than the peak-to-peak voltage of the first RF power source.

With the present invention described above greater power can be coupled to the system or the power can be coupled more efficiently. This surprising effect in turn increases the flux of the system and enables higher etching rates to be achieved at low pressures. Moreover, with the present invention unexpectedly a plasma may be generated at gas pressures formerly considered below the lower limit of working pressures.

The present invention also provides a reactor comprising an evacuable chamber having a port through which gas is supplied, first and second electrodes located within the chamber and spaced apart from one another, an RF power source connected between the first and second electrodes for generating a glow discharge plasma within the chamber and means for maintaining the gas within the chamber at a predetermined pressure in order to generate resonance in the plasma between the first and second electrodes.

In a further alternative aspect the present invention provides a reactor comprising an evacuable chamber having a port through which gas is supplied, first and second electrodes located within the chamber ,and spaced apart from one another, an RF power source connected between the first and second electrodes for generating a glow discharge plasma within the chamber and means for maintaining the gas within the chamber at a predetermined pressure in order to generate a voltage gradient in the plasma between the first and second electrodes within the chamber.

Reference is made herein to the generation of a glow discharge plasma and to a plasma reactor. It will be appreciated that at the pressures and frequencies of interest plasmas generated by a glow discharge conventionally have a plasma sheath region across which a substantial portion of the applied RF voltage is distributed (i.e. high electric field) and a luminous plasma region having approximately equal numbers of ions and electrons across which only a relatively small portion of the voltage is distributed (i.e. low electric field) as shown by FIG. 1, the plasma generated is in the form of an ionised gas having approximately equal numbers of positive ions and electrons. It is not intended that reference to a plasma implies the ionised gas either to be in equilibrium or linear. Indeed, it is believed that when resonance is generated the ionised gas is non-linear and not in equilibrium.

BRIEF DESCRIPTION OF THE DRAWINGS

An embodiment of the present invention will now be described by way of example only with reference to the accompanying drawings, in which.

DETAILED DESCRIPTION

Figure 1:
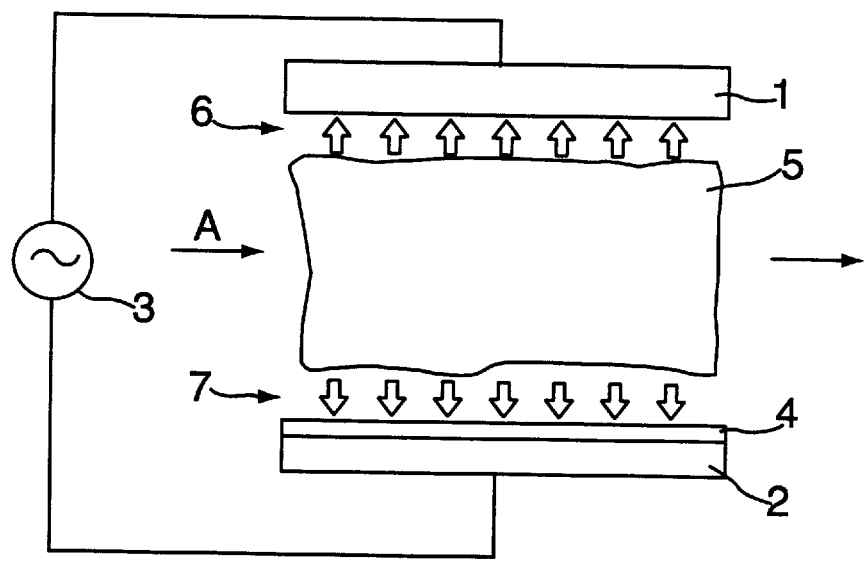
FIG. 1 is a schematic diagram of a conventional plasma reactor.
Figure 2:
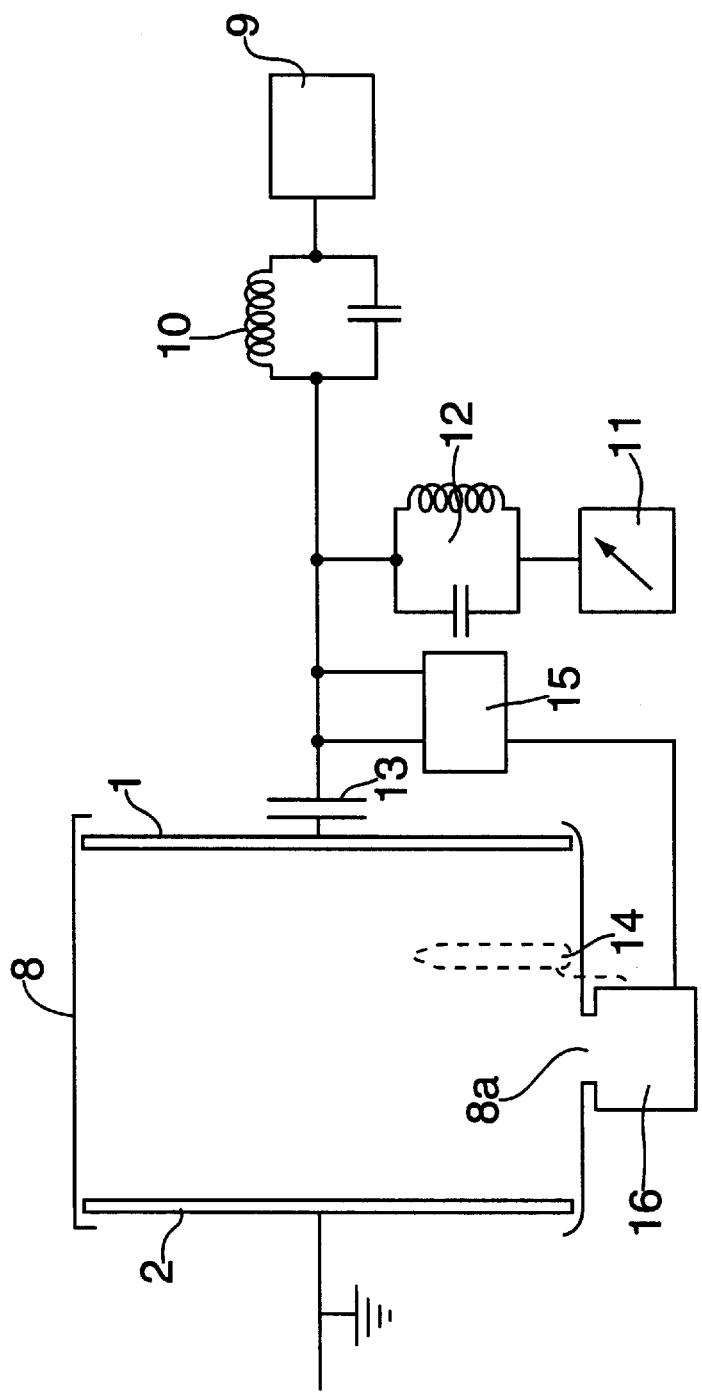
FIG. 2 is a schematic diagram of an improved plasma reactor in accordance with the present invention.

With reference to FIG. 2 a plasma reactor is shown similar to that of FIG. 1. The plasma reactor has a first electrode 1 which is driven by an RF power source and a second electrode 2 which is grounded. There are certain applications of the plasma reactor in which the second electrode would not be connected to ground and it is a matter of design and the particular application of the plasma reactor which will decide this. The electrodes 1,2 are of the parallel plate type and are therefore mounted opposite and spaced apart from one another. The electrodes 1,2 are located within an vacuum chamber 8 which has a port 8a for the introduction of a gas under low pressure. The gas is supplied from a pump 16 which is arranged to control the pressure at which the gas is delivered and thereby the pressure of the gas within the chamber 8. The chamber 8 is arranged so that it may be opened to enable a wafer to be mounted on one or other of the electrodes. When in use the chamber 8 is sealed during the treatment of a wafer by either deposition or etching so as to maintain the pressure of the gas within the chamber and to avoid any poisoning of the gas used. Examples of suitable gases which could be used in wafer treatment with the plasma reactor are given earlier with reference to the conventional plasma reactor.

The electrodes 1,2 of the plasma reactor of FIG. 2 are connected to a voltage supply which provides power at a driving frequency of 13.56 MHz superposed with a selected higher frequency. The peak-to-peak voltage of the higher frequency power supply is designed to be less than the peak-to-peak voltage of the 13.56 MHz power supply. For example $V_{RF1}$ at 13.56 MHz may be 200 v whereas $V_{RF2}$ at 54.24 MHz may be 20 v. The voltage supply shown in FIG. 2 includes a 13.56 MHz amplifier 9 which is connected to a tuneable power choke 10 and a power generator 11 which is connected to a 13.56 MHz choke 12. The outputs of the power choke 10, and choke 12 are connected to the driven electrode 1 via a DC blocking capacitor 13.

The driving frequency is chosen to be 13.56 MHz since this is a frequency which is presently available for use to industry. It will of course be appreciated though that any suitable RF frequency voltage supply may be used with the plasma reactor of FIG. 2. The higher frequency is carefully selected either theoretically, or by experiment. The higher frequencies may be selected to be harmonics of the driving frequency. The higher frequency should be less than the electron plasma resonance frequency which is the frequency at which the plasma resonates and the RF current between the electrodes tends to a minimum.

In order to generate a plasma the RF power supply is connected between the electrodes 1,2 and the pressure of the gas within the chamber 8 is carefully controlled by the pump 16 so as to be maintained at a predetermined level. At the predetermined pressure, which is preferably below 10 Pa, resonance is generated in the glow discharge plasma between the electrodes 1,2. This resonance greatly increases the coupling of the power to the system and is seen as an increase in the RF current between the electrodes. In circumstances at a particular driving frequency where the pressure needed to generate resonance is not known, the pump 16 may be used to vary the pressure of the gas within the chamber 8 until resonance is generated. In this way the desired pressure can be determined and thereafter the pump 16 is used to maintain the gas at the desired pressure.

Resonance may be detected in a number of different ways. For example, an RF current meter 15 may be used to monitor the current between the electrodes 1,2 externally of the chamber 8. The RF current increases when resonance has been established within the reactor. Alternatively, a high impedance probe 14 may be used to detect the presence of a voltage gradient within the plasma between the electrodes 1,2. The probe 14 may either be connected to a broad band choke or may utilise the electrical properties of the sheaths, which are formed either side of the plasma, in order to ensure the high impedance necessary to measure the voltages involved. It should be borne in mind that the resonance referred to herein is a resonance of the charged particles in the chamber and is not a resonance of the probe.

Figure 3:
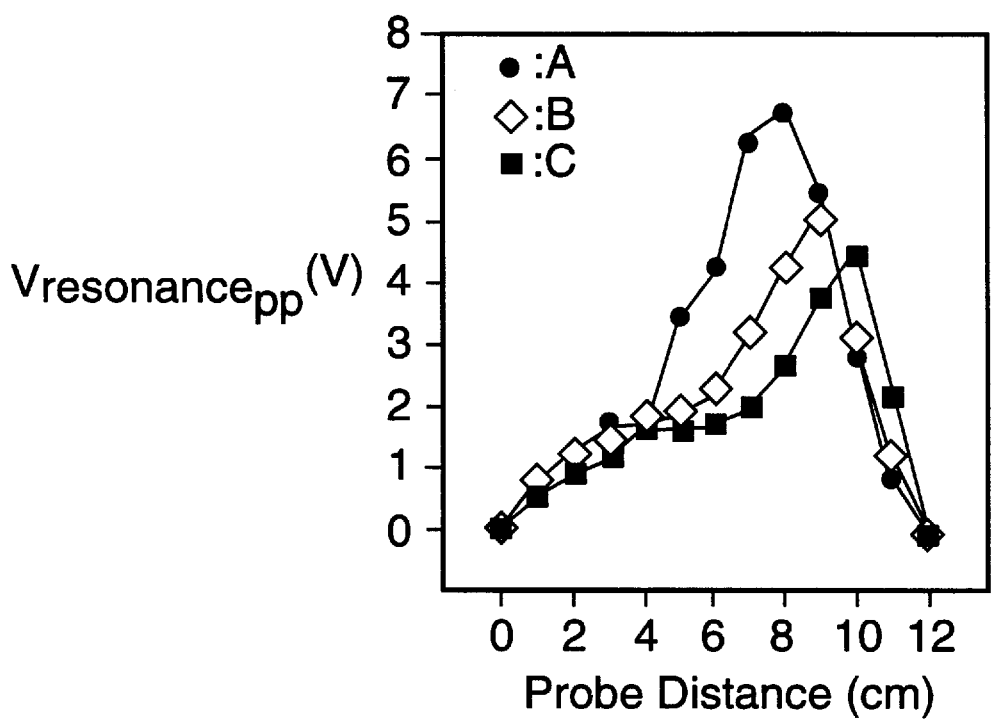
FIG. 3 is a graph of the voltages measured between the electrodes of the improved plasma reactor at three different resonant frequencies.

An example of resonance is shown in FIG. 3. In this case the resonant harmonics were produced by the non linearity of the sheath. FIG. 3 shows the results of the voltages measured by a high impedance probe 14 at different distances from the ground electrode 2 at three different pressures which correspond to three different resonant frequencies. The three different frequencies are in fact the fourth, fifth and sixth harmonics of the driving frequency, 13.56 MHz, of the power source. The first curve, A, is for a gas pressure of 0.19 Pa with a resonant frequency of 54.24 MHz. The second curve, B, is for a gas pressure of 0.27 Pa with a resonant frequency of 67.80 MHz. the third curve, C, is for a gas pressure 0.48 Pa with a resonant frequency of 81.36 MHz.

In each case the curves suggest the presence of a standing wave between the electrodes 1,2 which implies resonance of the system with the harmonic becoming the fundamental of the resonance. The increased RF current between the electrodes 1,2 also implies that the phenomenon identified is resonance. Since, conventionally, no ac voltage gradient is usually present within a plasma reference herein to a plasma between the electrodes is used as reference to the ionised state of the gas in the region between the electrodes. In any event, at the pressures involved any plasma established between the electrodes would not be in thermal equilibrium.

It will of course be apparent that the pressures given above are pressures which are not normally associated with plasma generation. Indeed, to date plasmas have only been generated at lower pressures by means of strong external magnetic fields or other forms of external ionisation sources being applied. With the plasma reactor of FIG. 2 no additional external ionisation source is needed.

Although the plasma reactor described above utilises a power supply which superposes two RF frequencies, this is not essential. The results appearing in FIG. 3 were obtained with a plasma reactor having a single RF power supply at a frequency of 13.56 MHz. The strength of the resonance can however be increased by pumping the reactor by means of the variable frequency power generator 11 tuned to the resonant frequency which may be a harmonic of the driving frequency. The power generator 11 may also allow the size of the voltage to be varied.

A further alternative is for the electrodes 1,2 of the reactor to be driven solely at the higher resonance frequency in which case feed-back control may be implemented to compensate for resonance effects. At a fixed electrode spacing it will be understood that variation of either the pressure of the gas in the chamber or the frequency of the power source whilst maintaining the other variable fixed enables the reactor to be tuned to resonance.

Higher gas pressures than those described above may be used with the plasma reactor of FIG. 2 at lower electrode distances. For example, Using a gas such as argon, resonance can be generated up to pressures of 5 Pa for a 2 cm electrode separation.

Figure 4:
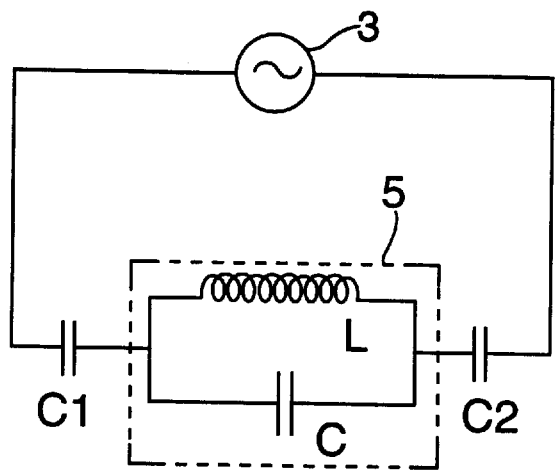
FIG. 4 is a simplified schematization of the electrical properties of the system.

Although the mechanism which results in the generation of a voltage gradient in the plasma between the electrodes is not yet fully understood it has been suggested that the voltage gradient is a result of a resonance between the plasma and the sheaths. To assist in an understanding of one theory of the mechanism FIG. 4 shows a schematization of the electrical properties of the plasma reactor. This schematization is not intended to represent the true system and instead is included solely to assist comprehension. The impedance of the plasma can be represented by a combination a resistance, inductance and capacitance. At low pressures and RF frequencies the resistance is considered to be negligible. Hence, the impedance of the plasma can be treated as a parallel circuit with inductance and capacitance. The sheaths which are generated between the plasma and each electrode also have capacitance and are represented in FIG. 4 by capacitors $C_1$ and $C_2$. This schematization does not of course allow for the damping effects which will be present in any real system.

The parallel LC circuit representing the plasma gives a plasma resonance which is already known to occur at very high frequencies. At frequencies below the plasma resonance frequency the plasma may be considered to be mainly inductive and can resonate in series with the capacitance of the sheaths. This series resonance produces a maximum in current transmission between the electrodes which is what is found to occur with the plasma reactor of FIG. 2.

It is suggested that the frequency $\omega$ of the series resonance of the plasma is dependent on the plasma resonance frequency $\omega_{pe}$, the thickness of the plasma P and the sum of the thicknesses of the sheaths S in the following relationship:

$$\omega = \frac{\omega_{pe}}{\sqrt{1 + P/S}}$$

Reference herein to the resonance in the glow discharge plasma in the plasma reactor is to be understood to be reference to the increase in RF current between the electrodes which occurs at particular driving frequencies and gas pressures and to the generation of a voltage gradient in the plasma between the electrodes in the form of standing waves.

With the plasma reactor of FIG. 2 and the method of operation described herein, greater power can be coupled in the system than with conventional reactors and at lower pressures than have been formerly used. This enables an increase in the rate of etching or deposition without loss of quality where the reactor is used for the treatment of wafers.

Alternative arrangements of the electrodes, probe, current meter and voltage supply for example are envisaged and are considered a matter of design without departing from the spirit and scope of the present invention.

We claim:

1. A method of generating a glow discharge plasma in an evacuable chamber containing a first electrode spaced apart by a separation from a second electrode, the method comprising:

evacuating the evacuable chamber;

supplying a gas at a pressure into the chamber;

connecting a first RF power source having a voltage, a current and a frequency between the first and second electrodes so as to generate the glow discharge plasma with a sheath; and adjusting at least one of the pressure, the electrode separation, and the first RF power source so as to generate plasma sheath resonance having at least one voltage gradient comprising a standing wave in the glow discharge plasma and the sheath between the first and second electrodes.

2. The method as defined in claim 1, wherein the electrode separation within the chamber is adjusted with respect to the pressure and the first RF power source.

3. The method as defined in claim 1, further comprising:

monitoring an RF current between the first and second electrodes while adjusting at least one of the pressure and the voltage of the first RF power source.

4. The method as defined in claim 1, further comprising:

connecting a second RF power source between the first and second electrodes.

5. The method as defined in claim 4, further comprising:

synchronously adjusting the frequencies of the first and second RF power sources; and monitoring an RF current between the first and second electrodes.

6. A method of generating a glow discharge plasma in an evacuable chamber containing a first electrode spaced apart by a separation from a second electrode, the method comprising:

evacuating the evacuable chamber;

supplying a gas at a pressure into the chamber;

connecting a first RF power source having a voltage, a current and a frequency between the first and second electrodes so as to generate the glow discharge plasma with a sheath; and adjusting at least one of the pressure and the first RF power source so as to generate at least one voltage gradient comprising a standing wave in the glow discharge plasma between the first and second electrodes.

7. The method as defined in claim 6, wherein the electrode separation within the chamber is adjusted with respect to the pressure and the first RF power source.

8. The method as defined in claim 6, wherein the standing wave is at a harmonic of the fundamental frequency of the first RF power source and the method further comprises:

adjusting at least one parameter from the group consisting of: the pressure; voltage of the first RF power source; current of the first RF power source; and electrode separation, to maintain the harmonic.

9. The method as defined in claim 6, further comprising:

connecting a second RF power source between the first and second electrodes.

10. The method as defined in claim 9, further comprising:

synchronously adjusting the frequencies of the first and second RF power sources; and monitoring an RF current between the first and second electrodes.

11. The method as defined in claim 6, further comprising:

monitoring an RF current between the first and second electrodes while adjusting at least one of the pressure and the voltage of the first RF power source.

12. A method of generating a glow discharge plasma in an evacuable chamber containing a first electrode spaced apart by a separation from a second electrode, the method comprising:

evacuating the evacuable chamber;

supplying a gas at a pressure into the chamber;

connecting a first RF power source having a voltage, a current and a frequency between the first and second electrodes so as to generate the glow discharge plasma with a sheath; and adjusting at least one of the pressure and the first RF power source so as to generate plasma sheath resonance in the glow discharge plasma and the sheath between the first and second electrodes so as to generate at least one voltage gradient comprising a standing wave in the glow discharge plasma and the sheath.

13. The method as defined in claim 12, wherein the electrode separation within the chamber is adjusted with respect to the pressure and the first RF power source.

14. The method as defined in claim 12, further comprising:

monitoring an RF current between the first and second electrodes while adjusting at least one of the pressure and the voltage of the first RF power source.

15. The method as defined in claim 12, further comprising:

connecting a second RF power source between the first and second electrodes.

16. The method as defined in claim 15, further comprising:

synchronously adjusting the frequencies of the first and second RF power sources; and monitoring an RF current between the first and second electrodes.

* * * * *